United States Patent
Lee et al.

(10) Patent No.: US 9,466,805 B2
(45) Date of Patent: Oct. 11, 2016

(54) SEMICONDUCTOR DEVICES AND METHODS OF MANUFACTURING THE SAME

(75) Inventors: Jiyoul Lee, Seoul (KR); Eok-su Kim, Seongnam-si (KR); Won-mook Choi, Hwaseong-si (KR); Sun-kook Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 213 days.

(21) Appl. No.: 13/242,478

(22) Filed: Sep. 23, 2011

(65) Prior Publication Data

US 2012/0256168 A1    Oct. 11, 2012

(30) Foreign Application Priority Data

Apr. 8, 2011  (KR) .................. 10-2011-0032729

(51) Int. Cl.
*H01L 29/49*    (2006.01)
*H01L 51/05*    (2006.01)
*H01L 51/00*    (2006.01)

(52) U.S. Cl.
CPC ....... *H01L 51/0562* (2013.01); *H01L 51/0545* (2013.01); *H01L 51/0036* (2013.01)

(58) Field of Classification Search
CPC ........... H01L 51/0562; H01L 51/0545; H01L 51/0036
USPC ....... 257/20, 40, 24, 977, E51.001, E51.002, 257/E51.005
See application file for complete search history.

(56) References Cited

U.S. PATENT DOCUMENTS

| | | | |
|---|---|---|---|
| 7,544,967 B2 * | 6/2009 | Kim et al. | 257/40 |
| 8,003,420 B2 * | 8/2011 | Maekawa | 438/34 |
| 8,101,474 B2 * | 1/2012 | Zhu | 438/175 |
| 8,344,357 B2 * | 1/2013 | Kobayashi | 257/24 |
| 8,389,996 B2 * | 3/2013 | Yabuta et al. | 257/69 |
| 8,497,502 B2 * | 7/2013 | Yaegashi | 257/43 |
| 8,614,479 B2 * | 12/2013 | Weng et al. | 257/328 |
| 2008/0191204 A1 * | 8/2008 | Kim et al. | 257/43 |
| 2010/0102299 A1 | 4/2010 | Murase et al. | |
| 2010/0330687 A1 | 12/2010 | Afzali - Ardakani et al. | |

FOREIGN PATENT DOCUMENTS

KR    P1993-0024211    * 12/1993

OTHER PUBLICATIONS

H.N. Tsao, et al. "Novel organic semiconductors and processing techniques for organic field-effect transistors", Physica Status Solidi A—Applications and Materials Science, vol. 205, Issue 3, pp. 421-429, (2008).

(Continued)

*Primary Examiner* — Michael Shingleton
(74) *Attorney, Agent, or Firm* — Harness, Dickey & Pierce, P.L.C.

(57) ABSTRACT

According to example embodiments, a semiconductor device includes a first electrode, a second electrode apart from the first electrode, and an active layer between the first and second electrodes. The active layer includes first and second layers, the first layer contacts the first and second electrodes, and the second layer is separated from at least one of the first and second electrodes.

27 Claims, 11 Drawing Sheets

(56) References Cited

OTHER PUBLICATIONS

Yang Cao, et al. "High-Performance Langmuir-Blodgett Monolayer Transistors with High Responsivity", Angewandte Chemie-International Edition, vol. 49, Issue 36, pp. 6319-6323 (2010).
Yongsheng Chen, et al. "Towards Flexible All-Carbon Electronics: Flexible Organic Field-Effect Transistors and Inverter Circuits Using Solution-Processed All-Graphene Source/Drain/Gate Electrodes", Nano Res. 2010, 3(10), pp. 714-721, (2010).
H. N. Tsao, et al. "Novel organic semiconductors and processing techniques for organic field-effect transistors." Phys. Stat. Sol. (a) 205, No. 3, 421-429 (2008).
Yang Cao, et al. "High-Performance Langmuir-Blodgett Monolayer Transistors with High Responsivity." Angew. Chem. Int. Ed. 2010, 49, 6319-6323.
Yongsheng Chen, et al. "Towards Flexible All-Carbon Electronics: Flexible Organic Field-Effect Transistors and Inverter Circuits Using Solution-Processed All-Graphene Source/Drain/Gate Electrodes." Nano Res. 2010, 3(10): 714-721.

\* cited by examiner

SEMICONDUCTOR DEVICES AND METHODS OF MANUFACTURING THE SAME

CROSS-REFERENCE TO RELATED APPLICATIONS

This application claims priority under U.S.C. §119 to Korean Patent Application No. 10-2011-0032729, filed on Apr. 8, 2011, in the Korean Intellectual Property Office (KIPO), the entire contents of which are incorporated herein by reference.

BACKGROUND

1. Field

Example embodiments relate to semiconductor devices and methods of manufacturing the same.

2. Description of the Related Art

As the demand for multi-function and high performance of semiconductor devices (electronic devices) increases recently, related research/development has been made. In this regard, organic semiconductor devices (electronic devices) using an organic semiconductor have drawn attention.

Organic semiconductor devices (electronic devices) may have various functions depending on the type of a functional group used in an organic semiconductor. Thus, organic semiconductor devices (electronic devices) may be used in various sensors or switching devices, or for other purposes. However, since organic semiconductor devices (electronic devices) have low mobility, it is difficult to increase the range of application, and there is a limitation in improving the performance of organic semiconductor devices.

SUMMARY

According to example embodiments, a semiconductor device includes a first electrode, a second electrode apart from the first electrode, and an active layer between the first and second electrodes. The active layer includes first and second layers, the first layer contacts the first and second electrodes, and the second layer is separated from at least one of the first and second electrodes.

According to example embodiments, the first layer includes an organic semiconductor.

According to example embodiments, the second layer includes a material having higher electrical conductivity than the first layer.

According to example embodiments, the second layer includes a material having higher charge mobility than the first layer.

According to example embodiments, the second layer includes a metallic layer or a semiconductor layer.

According to example embodiments, the second layer includes at least one selected from the group consisting of graphene, silver (Au), copper (Cu), nickel (Ni), platinum (Pt), and molybdenum disulphide (MoS2).

According to example embodiments, the first layer and the second layer are in ohmic contact with each other.

According to example embodiments, a portion of the first layer is between the second layer and at least one of the first and second electrodes.

According to example embodiments, the semiconductor device further includes a gate configured to apply an electric field to the active layer.

According to example embodiments, the second layer is closer to the gate compared to the first layer.

According to example embodiments, the gate is below the active layer.

According to example embodiments, the gate is above the active layer.

According to example embodiments, the first and second electrodes contact a lower surface portion of the first layer.

According to example embodiments, the first and second electrodes contact an upper surface portion of the first layer.

According to example embodiments, a gap between the second layer and at least one of the first and second electrodes is less than several tens of micrometers (µm).

According to example embodiments, when the second layer is at a same level as the first and second electrodes, a gap between the second layer and at least one of the first and second electrodes is in a range of several hundreds of nanometers (nm) to several tens of micrometers (µm).

According to example embodiments, when the second layer is at a different level than the first and second electrodes, a gap between the second layer and at least of the first and second electrodes is in a range of several tens of nanometers (nm) to several micrometers (µm).

According to example embodiments, the semiconductor device is flexible.

According to example embodiments, the semiconductor device is a sensor.

According to example embodiments, the sensor is a chemical sensor or an optical sensor.

According to example embodiments, the semiconductor device is a switching device or a sensor.

According to example embodiments, the semiconductor device is a thin film transistor.

According to example embodiments, a transistor includes a source and a drain separated from each other, a channel layer between the source and the drain, and a gate configured to apply an electric field to the channel layer. The channel layer is a multi-layer structure including a first layer and a second layer, the first layer includes an organic semiconductor and contacting the source and the drain, and the second layer includes a material having higher electrical conductivity than the organic semiconductor and is separated from at least one of the source and the drain.

According to example embodiments, the second layer is closer to the gate compared to the first layer.

According to example embodiments, the second layer is a metallic layer or a semiconductor layer. The second layer may include at least one selected from the group consisting of graphene, Au, Cu, Ni, Pt, and $MoS_2$.

BRIEF DESCRIPTION OF THE DRAWINGS

Example embodiments will be more clearly understood from the following brief description taken in conjunction with the accompanying drawings. FIGS. 1-13 represent non-limiting, example embodiments as described herein.

FIGS. 1 through 4 are cross-sectional views of a semiconductor device having a 3-terminal structure, according to example embodiments;

FIGS. 5 through 8 are cross-sectional views of a semiconductor device having a 2-terminal structure, according to example embodiments;

FIG. 11 is an example of a perspective view of the semiconductor device illustrated in FIG. 1;

FIG. 12 is a graph showing variations in gate voltage-drain current ($V_{GS}$-$I_{DS}$) characteristics of semiconductor devices according to example embodiments and comparative examples; and FIG. 13 is a graph showing variations in gate voltage-drain current ($V_{GS}$-$I_{DS}$) characteristics of semiconductor devices according to example embodiments and comparative examples.

Figure 1:
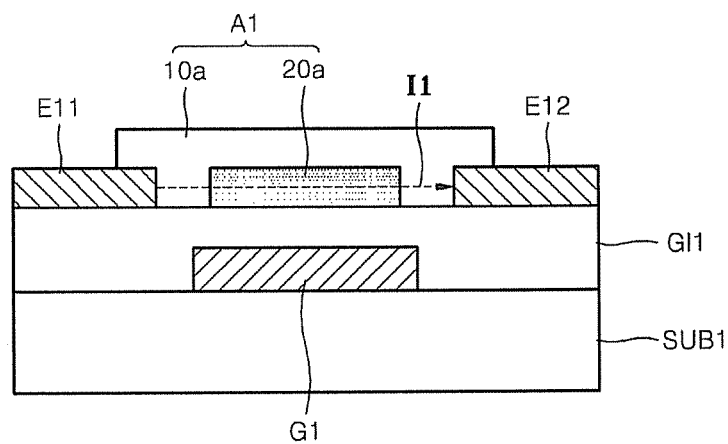

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. In the drawings, the thicknesses of layers and regions are exaggerated for clarity. Like reference numerals throughout the detailed description denote like elements.

FIG. 1 is a cross-sectional view of a semiconductor device according to example embodiments. Referring to FIG. 1, a gate G1 may be disposed on a predetermined substrate SUB1. The substrate SUB1 may be a flexible substrate or a rigid substrate. For example, the substrate SUB1 may be a flexible substrate, such as a plastic substrate, but may be one selected from among various substrates which are used in a general process of manufacturing a semiconductor device, such as a glass substrate, a silicon substrate, and the like. The substrate SUB1 may be transparent or opaque. The gate G1 may be formed of one selected from among various metals used to form an electrode in the general process of manufacturing a semiconductor device, conductive oxide, or other materials. A gate insulating layer GI1 may be disposed to cover the gate G1. The gate insulating layer GI1 may include silicon oxide, silicon oxynitride, or silicon nitride but materials, such as a high-k dielectric material having a larger dielectric constant than silicon nitride, or an organic insulating material may also be used. The gate insulating layer GI1 may have a single layer structure or a multi-layer structure.

A first electrode E11 and a second electrode E12 which are apart from each other may be disposed on the gate insulating layer GI1. The first and second electrodes E11 and E12 may be disposed on either sides of the gate G1. One of the first and second electrodes E11 and E12 may be a source electrode, and the other one may be a drain electrode. The first and second electrodes E11 and E12 may be formed of one selected from among various metals, conductive oxide, or another material, like in the gate G1.

An active layer A1 may be disposed on the gate insulating layer GI1 between and at least partially covering the first and second electrodes E11 and E12. The active layer A1 may include at least two material layers. For example, the active layer A1 may include a first layer 10a and a second layer 20a. The first layer 10a may contact the first and second electrodes E11 and E12. The second layer 20a may be separated from at least one of the first and second electrodes E11 and E12. For example, the second layer 20a may be separated from the first and second electrodes E11 and E12 by a predetermined (or, alternatively desired) gap. The second layer 20a separated from the first and second electrodes E11 and E12 may be formed on the gate insulating layer GI1 between the first and second electrodes E11 and E12, and the first layer 10a may be formed to contact the first and second electrodes E11 and E12 while covering the second layer 20a. Thus, a portion of the first layer 10a may be disposed between the second layer 20a and the first electrode E11 and between the second layer 20a and the second electrode E12. In addition, the second layer 20a may be disposed closer to the gate G1 compared to the first layer 10a. Hereinafter, materials for forming the first layer 10a and the second layer 20a and their characteristics will be described in detail.

The first layer 10a may include an organic semiconductor. For example, the first layer 10a may be an organic semiconductor layer. The organic semiconductor may be a polymer (high-molecular) semiconductor or a low-molecular semiconductor. In detail, the organic semiconductor may be a thiophene-based or acene-based semiconductor. However, this is just an example, and other organic semiconductors may be used as the material for forming the first layer 10a. When the first layer 10a is an organic semiconductor layer, the first layer 10a may include a predetermined (or, alternatively desired) functional group. The function/characteristics of the first layer 10a may vary according to the type of the functional group.

The second layer 20a may include a material having higher electrical conductivity and/or higher charge mobility than the first layer 10a. In addition, the second layer 20a may include a material that ohmic-contacts the first layer 10a. The second layer 20a may be a metallic layer or a semiconductor layer. For example, the second layer 20a may include graphene. In this regard, the second layer 20a may include one or more graphene sheets. For example, the second layer 20a may include about 1 to 10 graphene sheets. The graphene sheet is a hexagonal single-layer structure formed of carbon. The graphene sheet may have two-dimensional ballistic transport characteristics. Two-dimensional ballistic transport of charges within a material represents that charges move in a state where there is minimum resistance due to scattering. Thus, the graphene sheet may have low resistivity and high charge mobility. In addition, the graphene sheet may have excellent transmittance. When the second layer 20a is formed of a small number of graphene sheets including about 10 layers or less, the second layer 20a may have similar resistivity and light transmittance to those of one graphene sheet. Thus, the second layer 20a including about 1 to 10 graphene sheets may have excellent electrical/optical characteristics. In addition, the graphene sheet may have flexible characteristics. The second layer 20a may also be formed of other materials than graphene. For example, the second layer 20a may include a metal, such as gold (Au), copper (Cu), nickel (Ni), and platinum (Pt), or a semiconductor, such as molybdenum disulphide ($MoS_2$). However, a material for forming the second layer 20a described above is just an example, and various other materials may be used as the material for forming the second layer 20a. A material that has higher electrical conductivity or higher charge mobility than the first layer 10a, may be used as the material for forming the second layer 20a.

A channel may be formed in the active layer A1 due to the gate G1. In other words, the channel may be formed in the active layer A1 due to an electric field applied by the gate G1 to the active layer A1. The channel may be formed in a portion of the active layer A1 adjacent to the gate G1. In detail, the channel may be formed in the second layer 20a and portions of the first layer 10a disposed at both sides of the second layer 20a. Thus, a current I1 between the first electrode E11 and the second electrode E12 may flow through the second layer 20a and the portions of the first layer 10a disposed at both sides of the second layer 20a. As a gap between the second layer 20a and the first and second electrodes E11 and E12 decreases, the length of the portions of the first layer 10a between the second layer 20a and the first and second electrodes E11 and E12 decreases. Thus, a majority of the current I1 may flow through the second layer 20a. Since the second layer 20a has higher electrical conductivity and/or higher charge mobility than the first layer 10a, the mobility of a semiconductor device may increase due to the second layer 20a. When a semiconductor device uses an active layer (channel layer) having a single layer structure formed of an organic semiconductor without the second layer 20a, the mobility of the active layer is low so that it is not easy to increase the range (field) of application of the semiconductor device and there is a limitation in improving performance. However, in the example embodiments, since the mobility of the active layer A1 may increase by using the second layer 20a, drawbacks of a conventional organic semiconductor device may be overcome. In detail, problems due to low mobility of the organic semiconductor may be solved while maintaining multi-function characteristics of the organic semiconductor.

On the other hand, when an active layer (channel layer) having a single layer structure formed of material having high electrical conductivity, such as graphene, is used, the active layer may contribute to improvements in mobility but on/off characteristics of such a conventional art semiconductor device may not be good. This is because, when the active layer (channel layer) having a single layer structure formed of material having high electrical conductivity, such as graphene, is used, an off-current level may be considerably high. Thus, an on/off current ratio of the semiconductor device may be low. However, in example embodiments, when the second layer 20a having high conductivity is separated from the first and second electrodes E11 and E12 by a gap and the material of the first layer 10a is formed between the second layer 20a and the first and second electrodes E11 and E12, excellent on/off characteristics may be obtained. In other words, a high on/off current ratio may be obtained. Thus, according to example embodiments, a semiconductor device having multi-functions and excellent performance (high mobility, high on/off current ratio etc.) may be implemented.

A gap between the second layer 20a and the first and second electrodes E11 and E12 may be less than several micrometers (μm). As illustrated in FIG. 1, when the second layer 20a is disposed at the same level as the first and second electrodes E11 and E12, the gap between the second layer 20a and the first and second electrodes E11 and E12 may be about several hundreds of nanometers (nm) to several tens of micrometers (μm), for example, about several μm to several tens of μm. An appropriate gap between the second layer 20a and the first and second electrodes E11 and E12 may vary according to the material for the first layer 10a and the material for the second layer 20a, etc.

Additionally, characteristics of the semiconductor device of FIG. 1 may be affected by surface processing (surface treatment) of the gate insulating layer GI1. For example, when the surface (top surface) of the gate insulating layer GI1 is processed by using a hydrophobic material, the mobility of the semiconductor device may increase. This is because, if the surface of the gate insulating layer GI1 is processed with the hydrophobic material, characteristics of the first layer 10a are affected by the surface processing. However, the surface processing of the gate insulating layer GI1 is optional. The presence of the second layer 20a in addition to surface processing the gate insulating layer GI1 with the hydrophobic material may result in improvement in the performance (for example, mobility) of the semiconductor device. The desired gap between the second layer 20a and the first and second electrodes E11 and E12 may vary according to the surface processing of the gate insulating layer GI1.

The first layer 10a formed of an organic semiconductor may be flexible. The second layer 20a formed of graphene or metal may also be flexible. Even when the second layer 20a is formed of a semiconductor, the second layer 20a may have a flexible characteristic according to the type of the semiconductor. Thus, when the substrate SUB1 is flexible, the semiconductor of FIG. 1 may be a flexible device. Since a flexible substrate may be used as the substrate SUB1 to manufacture a semiconductor device, according to example embodiments, a flexible semiconductor device may be easily implemented. The process of manufacturing the semiconductor device will be described later in more detail.

Figure 11:
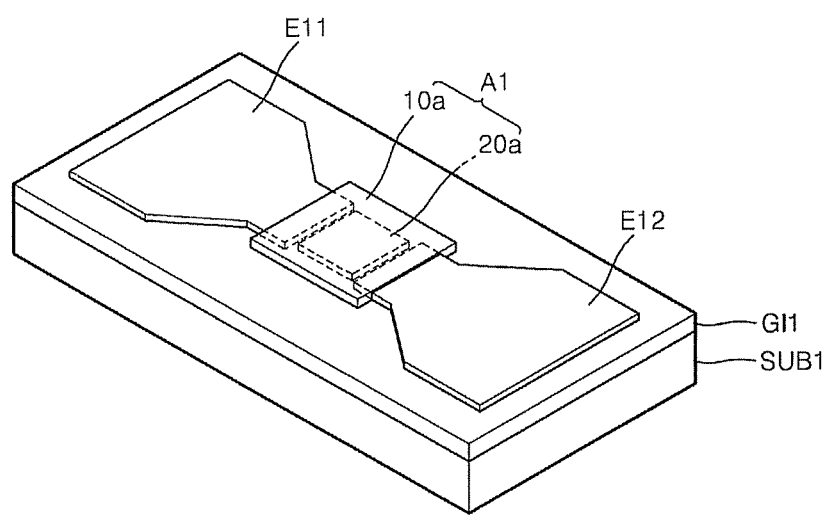

A perspective view of the semiconductor device illustrated in FIG. 1 may be as illustrated in FIG. 11, for example. For convenience of explanation, the gate G1 of FIG. 1 is not shown in FIG. 11.

Referring to FIG. 11, the first electrode E11 and the second electrode E12 are disposed on the gate insulating layer GI1 and separated from each other by a predetermined (or, alternatively desired) gap, and the active layer A1 may be disposed between the first and second electrodes E11 and E12. The active layer A1 may include the first layer 10a and the second layer 20a. The second layer 20a may be formed between the first and second electrodes E11 and E12 to be separated therefrom by a predetermined (or, alternatively desired), and the first layer 10a may be formed to cover the second layer 20a and to contact the first and second electrodes E11 and E12. Each of the first and second electrodes E11 and E12 may include a first portion having a relatively small width and a second portion having a relatively large width. The first portion may be adjacent to the active layer A1, and the second portion may be apart from the active layer A1 by a predetermined (or, alternatively desired) gap. In other words, each of the first and second electrodes E11 and E12 may have a small width in a portion where they are adjacent to the active layer A1 and may have a large width in a portion where they are apart from the active layer A1. A portion having a relatively large width, i.e., the second portion may be a portion for obtaining a contact area. However, the structure of FIG. 11 is just an example and may vary in various ways.

Figure 2:
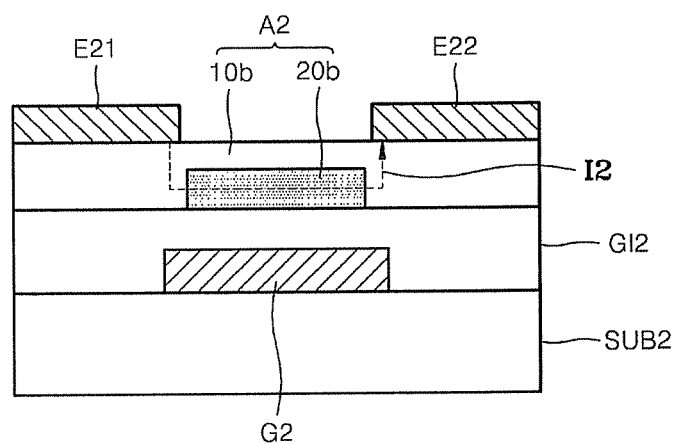

FIG. 2 is a cross-sectional view of a semiconductor device, according to example embodiments.

Referring to FIG. 2, a gate G2 may be disposed on a substrate SUB2, and a gate insulating layer GI2 may be disposed to cover the gate G2. An active layer A2 may be disposed on the gate insulating layer GI2, and first and second electrodes E21 and E22 may be disposed on the active layer A2 and may be separated from each other. The active layer A2 may include a first layer 10b and a second layer 20b. The second layer 20b may be formed on the gate insulating layer GI2 above the gate G2, and the first layer 10b may be formed to cover the second layer 20b. Thus, the first layer 10b may contact the first and second electrodes E21 and E22, and the second layer 20b may be separated from the first and second electrodes E21 and E22 by a predetermined (or, alternatively desired) gap. A material for forming the first layer 10b and a material for forming the second layer 20b may be the same as or similar to the material for forming the first layer 10a and the material for forming the second layer 20a, respectively. In detail, the first layer 10b may be an organic semiconductor layer, and the second layer 20b may be a layer formed of graphene or metal, or a layer formed of a semiconductor. Materials of the substrate SUB2, the gate G2, the gate insulating layer GI2, the first electrode E21, and the second electrode E22 may be the same as or similar to the materials of the substrate SUB1, the gate G1, the gate insulating layer GI1, the first electrode E11, and the second electrode E12 illustrated in FIG. 1, respectively.

A channel may be formed in the active layer A2 due to the gate G2. The channel may be formed in a portion of the active layer A2 that is close to the gate G2, for example, primarily in a lower portion of the active layer A2. The channel may be formed in the second layer 20b and portions of the first layer 10b disposed at both sides of the second layer 20b. Thus, a current I2 between the first electrode E21 and the second electrode E22 may flow through the second layer 20b and the portions of the first layer 10b between the second layer 20b and the first and second electrodes E21 and E22. The path of the current I2 is similar to the path of the current I1 of FIG. 1.

When the second layer 20b of the active layer A2 is disposed at a different level than the first and second electrodes E21 and E22, as illustrated in FIG. 2, a gap between the second layer 20b and the first and second electrodes E21 and E22 may be less than several μm. For example, the gap between the second layer 20b and the first and second electrodes E21 and E22 may be about several tens of nm to several μm. However, this is just an example, and an appropriate gap between the second layer 20b and the first and second electrodes E21 and E22 may vary according to the material for the first layer 10b, the material for the second layer 20b, and surface processing of the gate insulating layer GI2 and as per design and circuit requirements.

Although FIGS. 1 and 2 illustrate the semiconductor device (thin film transistor) having a bottom-gate structure in which the gate G1 or G2 is disposed below the active layer A1 or A2, according to example embodiments, a semiconductor device (thin film transistor) having a top-gate structure may be used. Examples thereof are shown in FIGS. 3 and 4.

Figure 3:
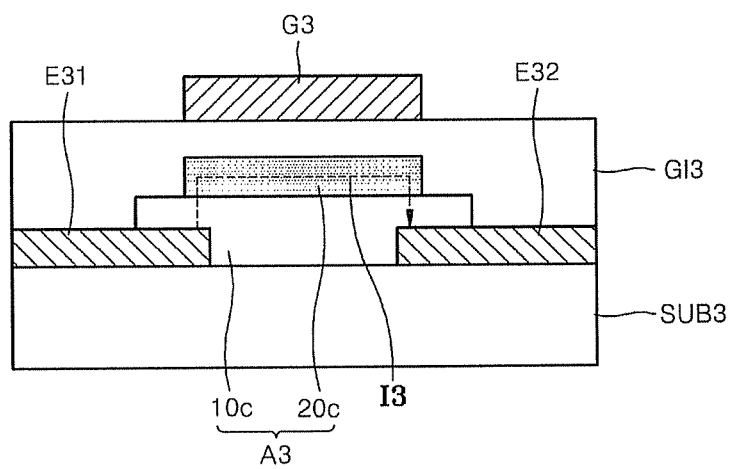

Referring to FIG. 3, first and second electrodes E31 and E32 may be disposed on a substrate SUB3 to be separated from each other. An active layer A3 may be disposed on the substrate SUB3 between the first and second electrodes E31 and E32. The active layer A3 may include a first layer 10c and a second layer 20c, for example. The first layer 10c may contact the first and second electrodes E31 and E32. The second layer 20c may be separated from at least one of the first and second electrodes E31 and E32 by a predetermined (or, alternatively desired) gap. For example, the second layer 20c may be separated from both the first and second electrodes E31 and E32 by a predetermined (or, alternatively desired)gap. A gate insulating layer GI3 may be disposed on the substrate SUB3 so as to cover the active layer A3 and the first and second electrodes E31 and E32. A gate G3 may be disposed on the gate insulating layer GI3. The gate G3 may be located above the active layer A3. Materials of the substrate SUB3, the first electrode E31, the second electrode E32, the first layer 10c, the second layer 20c, the gate insulating layer GI3, and the gate G3, respectively, may be the same as or similar to the materials of the substrate SUB1, the first electrode E11, the second electrode E12, the first layer 10a, the second layer 20a, the gate insulating layer GI1, and the gate G1 illustrated in FIG. 1.

A path of a current I3 between the first electrode E31 and the second electrode E32 may be as illustrated in FIG. 3. The current I3 may flow through the second layer 20c and portions of the first layer 10c between the second layer 20c and the first and second electrodes E31 and E32. A gap between the second layer 20c and the first and second electrodes E31 and E32 may be similar to that of FIG. 2. For example, the gap between the second layer 20c and the first and second electrodes E31 and E32 may be less than several μm, for example, in the range of about several tens of nm to several μm. However, an appropriate gap between the second layer 20c and the first and second electrode E31 and E32 may vary according to the materials for the first layer 10c and the second layer 20c.

Figure 4:
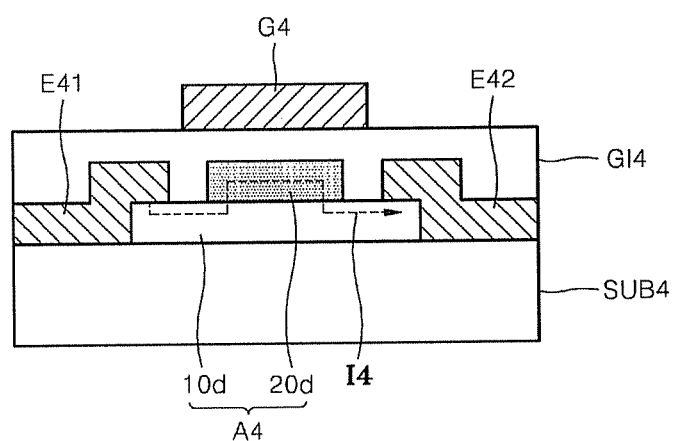

The structure of FIG. 3 may be modified, as illustrated in FIG. 4. Referring to FIG. 4, an active layer A4 may be disposed on a substrate SUB4. The active layer A4 may include a first layer 10d and a second layer 20d, for example. The second layer 20d may be disposed on the first layer 10d. The second layer 20d may have a smaller width than that of the first layer 10d. Both end portions of the first layer 10d may not be covered by the second layer 20d. First and second electrodes E41 and E42 may be formed on the substrate SUB4 and may contact the active layer A4. The first electrode E41 may contact one end of the first layer 10d, and the second layer E42 may contact the other end of the first layer 10d. At least one of the first and second electrodes E41 and E42 may be separated from the second layer 20d by a predetermined (or, alternatively desired) gap. For example, the first and second electrodes E41 and E42 may be separated from the second layer 20d. A gate insulating layer GI4 may be disposed on the substrate SUB4 so as to cover the active layer A4 and the first and second electrodes E41 and E42. A gate G4 may be disposed on the gate insulating layer GI4. The gate G4 may be located above the active layer A4. Materials for the substrate SUB4, the first layer 10d, the second layer 20d, the first electrode E41, the second electrode E42, the gate insulating layer GI4, and the gate G4, respectively, may be the same as or similar to the materials for the substrate SUB1, the first layer 10a, the second layer 20a, the first electrode E11, the second electrode E12, the gate insulating layer GI1, and the G1 illustrated in FIG. 1.

A path of a current I4 between the first electrode E41 and the second electrode E42 may be as illustrated in FIG. 4. The current I4 may flow through the second layer 20d and portions of the first layer 10d formed between the second layer 20d and the first and second electrodes E41 and E42. A gap between the second layer 20d and the first and second electrodes E41 and E42 may be similar to that of FIG. 1. The gap between the second layer 20d and the first and second electrodes E41 and E42 may be less than several tens of μm. For example, the gap between the second layer 20d and the first and second electrodes E41 and E42 may be in the range of about several hundreds of nm to several tens of μm, narrowly, about several μm to several tens of μm. However, an appropriate gap between the second layer 20d and the first and second electrodes E41 and E42 may vary according to the materials for forming the first layer 10d and the second layer 20d.

The semiconductor devices of FIGS. 1 through 4 may be used in various electronic devices for desired purposes. For example, the semiconductor devices of FIGS. 1 through 4 may be used as switching devices or driving devices. Alternatively, the semiconductor devices of FIGS. 1 through 4 may be used as sensing devices, for example, sensors. The sensing devices may be chemical sensors or optical sensors, for example. In this regard, the characteristics (e.g., electrical conductivity) of the active layers A1 to A4 of the sensing devices may vary due to chemical species or light.

In FIGS. 1 through 4, the semiconductor devices each having a 3-terminal structure in which three electrodes, first and second electrodes and a gate, are used. However, according to example embodiments, a semiconductor device having a 2-terminal structure may be used. Examples thereof are shown in FIGS. 5 through 8.

Figure 5:
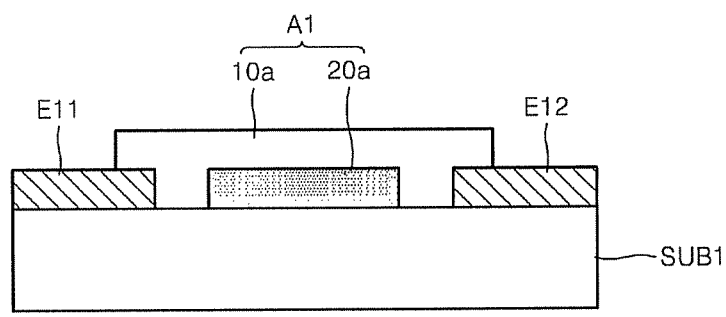
Figure 6:
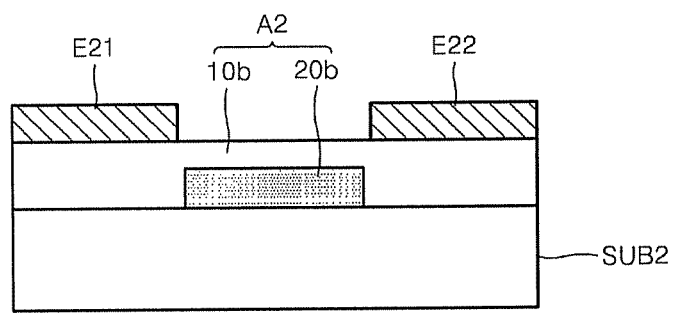
Figure 7:
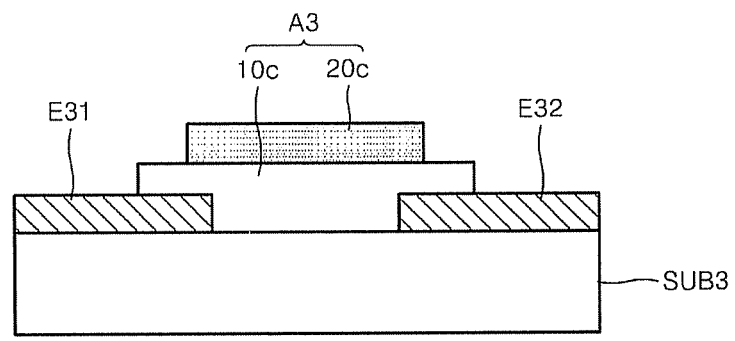
Figure 8:
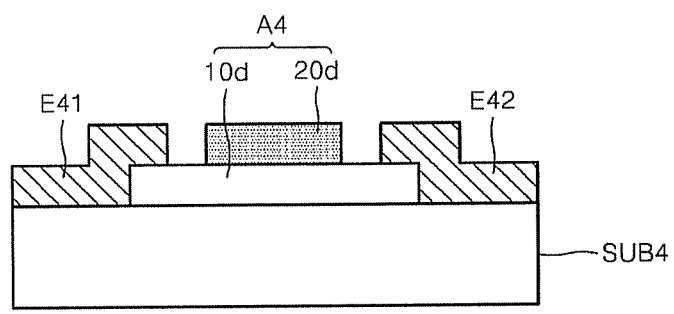

The structure of FIG. 5 may be the same as a structure from which the gate G1 and the gate insulating layer GI1 of FIG. 1 are removed. The structure of FIG. 6 may be the same as a structure from which the gate G2 and the gate insulating layer GI2 of FIG. 2 are removed. The structure of FIG. 7 may be the same as a structure from which the gate insulating layer GI3 and the gate G3 of FIG. 3 are removed. The structure of FIG. 8 may be the same as a structure from which the gate insulating layer GI4 and the gate G4 of FIG. 4 are removed. In FIGS. 5 through 8, a predetermined (or, alternatively desired) insulating layer may be further fogwed between each of the substrates SUB1 to SUB4 and each of the active layers A1 to A4. In this case, if necessary, the surface (top surface) of the insulating layer may be processed with a hydrophobic material.

The semiconductor devices having a 2-terminal structure as illustrated in FIGS. 5 through 8 may be used in various sensors. In detail, since the characteristics of the active layers A1 to A4, for example, electrical conductivity, may vary due to chemical species or light, the semiconductor devices illustrated in FIGS. 5 through 8 may be used as chemical sensors or optical sensors. When the materials for forming the first layers 10a to 10d of the active layers A1 to A4 are organic semiconductors, functions of the semiconductor devices may be determined according to types of functional groups contained in the organic semiconductors. The semiconductor devices of FIGS. 5 through 8 may also be applied to other electronic devices as well as the sensors.

FIGS. 9A through 9D are cross-sectional views illustrating a method of manufacturing a semiconductor device, according to example embodiments.

Figure 9A:
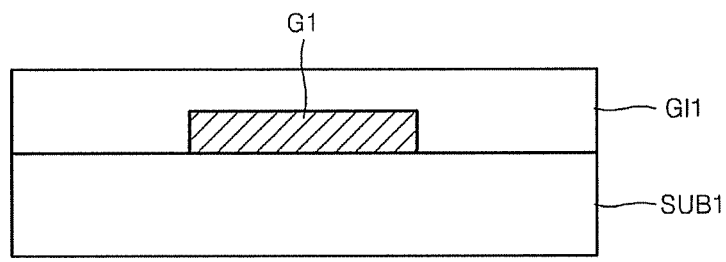
FIGS. 9A through 9D are cross-sectional views illustrating a method of manufacturing a semiconductor device, according to example embodiments.

Referring to FIG. 9A, a gate G1 may be formed on a substrate SUB1. The substrate SUB1 may be a flexible substrate or a rigid substrate. For example, the substrate SUB1 may be a flexible substrate, such as a plastic substrate, but may be one selected from among various substrates, such as a glass substrate, a silicon substrate, and the like. The substrate SUB1 may be transparent or opaque. The gate G1 may be formed of one selected from among various metals used to form an electrode, conductive oxide, or other materials. Next, a gate insulating layer GI1 may be formed to cover the gate G1. The gate insulating layer GI1 may include silicon oxide, silicon nitrogen oxide, or silicon nitride but another material, such as a high-k dielectric material having a larger dielectric constant than silicon nitride, or an organic insulating material. The gate insulating layer GI1 may have a single layer structure or a multi-layer structure. In addition, if necessary, the surface (top surface) of the gate insulating layer GI1 may be processed with a hydrophobic material.

Figure 9B:
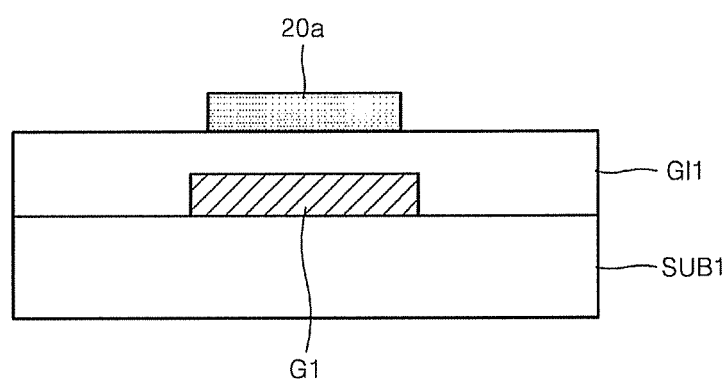

Referring to FIG. 9B, a second layer 20a may be formed on the gate insulating layer GI1. The second layer 20a may be formed above the gate G1. The second layer 20a may be formed of a metallic material or a semiconductor material. For example, the second layer 20a may be formed of graphene. In this regard, the second layer 20a may be formed to include one or more graphene sheets. For example, the second layer 20a may include about 1 to 10 graphene sheets. When the second layer 20a is formed of graphene, a transfer method, for example, may be used. After a graphene layer may be formed on a predetermined (or, alternatively desired) substrate and then the graphene layer may be transferred onto the substrate SUB1 of FIG. 9B by the transfer method. The transfer method may be performed at a low temperature. Thus, various materials, such as a flexible plastic, and the like, may be used for the substrate SUB1. In addition, when the transfer method is used, it may be advantageous to form a large area semiconductor device and to improve productivity. However, the method of forming the second layer 20a is not limited to the above-described transfer method. The second layer 20a may be formed by using other methods. For example, the second layer 20a may be formed using a growth method using chemical vapor deposition (CVD). In this regard, a Cu layer, a Ni layer, or the like may be used as a catalyst layer for growing the second layer 20a. In more detail, the catalyst layer (Cu layer, Ni layer, etc.) may be formed on the gate insulating layer GI1, and then the second layer 20a may be grown on the catalyst layer by using CVD. The second layer 20a may also be formed of other desired materials than graphene. For example, the second layer 20a may be formed of metal, such as Au, Cu, Ni, or Pt, or a semiconductor, such as $MoS_2$. The above mentioned materials for forming the second layer 20a are just examples, and other materials may also be used.

Figure 9C:
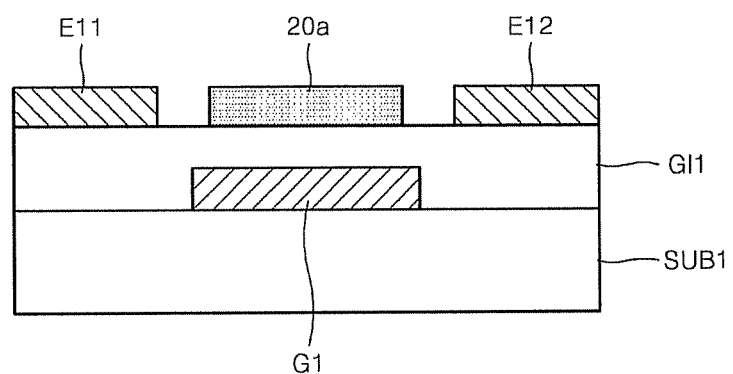

Referring to FIG. 9C, a first electrode E11 and a second electrode E12 may be formed on the gate insulating layer GI1 at both sides of the second layer 20a. One of the first and second electrodes E11 and E12 may be a source electrode, and the other one may be a drain electrode. The first and second electrodes E11 and E12 may be formed of one selected from among various metals, a conductive oxide, or other materials, like in the gate G1. At least one of the first and second electrodes E11 and E12 may be separated from the second layer 20a by a predetermined (or, alternatively desired) gap. For example, both the first and second electrodes E11 and E12 may be separated from the second layer 20a by a predetermined (or, alternatively desired) gap. In this regard, a gap between the first and second electrodes E11 and E12 and the second layer 20a may be less than several tens of μm. When the first and second electrodes E11 and E12 are formed at the same level as the second layer 20a, a gap between the first and second electrodes E11 and E12 and the second layer 20a may be about several hundreds of nm to several tens of μm, for example, several μm to several tens of μm.

Figure 9D:
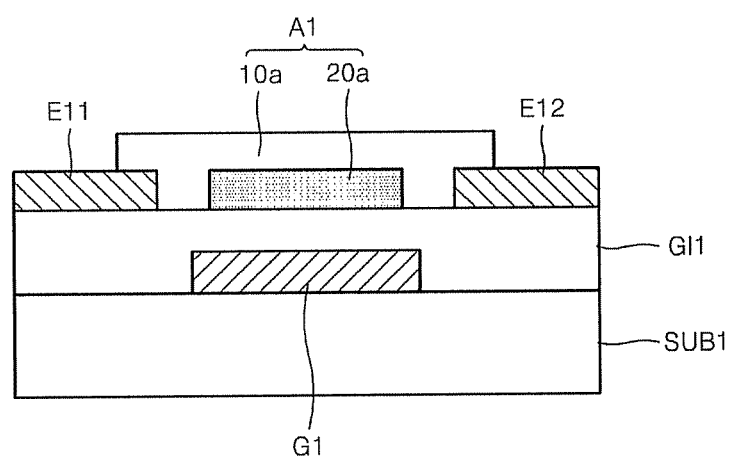

Referring to FIG. 9D, a first layer 10a may be formed to cover the second layer 20a and to contact the first and second electrodes E11 and E12. The first layer 10a and the second layer 20a may constitute an active layer A1. The first layer 10a may be formed of an organic semiconductor, for example. The organic semiconductor may be a polymer (high-molecular) semiconductor or a low-molecular semiconductor. The organic semiconductor may be a thiophene-based or acene-based semiconductor. However, this is just an example, and other organic semiconductors may be used as the material for forming the first layer 10a. When the first layer 10a is formed of an organic semiconductor, the first layer 10a may include a predetermined (or, alternatively desired) functional group. The function/characteristics of the first layer 10a may vary according to the type of the functional group. The first layer 10a may be formed by using a printing method, for example. The printing method may be performed using a low temperature process. Since the first layer 10a as well as the second layer 20a may be formed using a low temperature process, a flexible material may be applied as a material for the substrate SUB1. However, a method of forming the first layer 10a is not limited to the printing method. The first layer 10a may also be formed by using other desired methods. In addition, the first layer 10a may also be formed of other materials than the organic semiconductor.

On the other hand, electrical conductivity and/or charge mobility of the first layer 10a may be lower than that of the second layer 20a. In other words, electrical conductivity and/or charge mobility of the second layer 20a may be higher than that of the first layer 10a. In addition, the first layer 10a may be in ohmic-contact with the second layer 20a.

The method illustrated in FIGS. 9A through 9D may be modified in various ways. For example, in FIGS. 9B and 9C, the first layer 20a is formed and then, the first and second electrodes E11 and E12 are formed. In example embodiments, the first and second electrodes E11 and E12 are formed and then, the second layer 20a may be formed. In addition, after the first layer 10a is formed, the first and second electrodes E11 and E12 may be formed on the first layer 10a. In this case, the semiconductor device illustrated in FIG. 2 may be manufactured. Otherwise, various modifications may be conducted.

FIGS. 10A through 10D are cross-sectional views illustrating a method of manufacturing a semiconductor device, according to example embodiments.

Figure 10A:
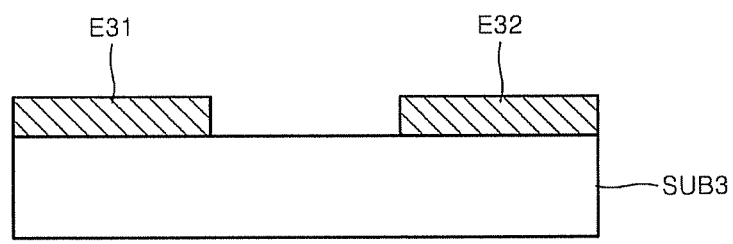
FIGS. 10A through 10D are cross-sectional views illustrating a method of manufacturing a semiconductor device, according to example embodiments.

Referring to FIG. 10A, first and second electrodes E31 and E32 may be formed on a substrate SUB3 separated from each other.

Figure 10B:
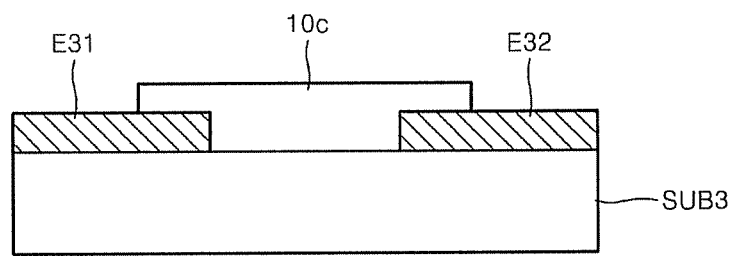

Referring to FIG. 10B, a first layer 10c may be formed on the substrate SUB3 between the first and second electrodes E31 and E32. The first layer 10c may be formed of an organic semiconductor, for example. A method of forming the first layer 10c may be the same as or similar to the method of forming the first layer 10a as illustrated in FIG. 9D.

Figure 10C:
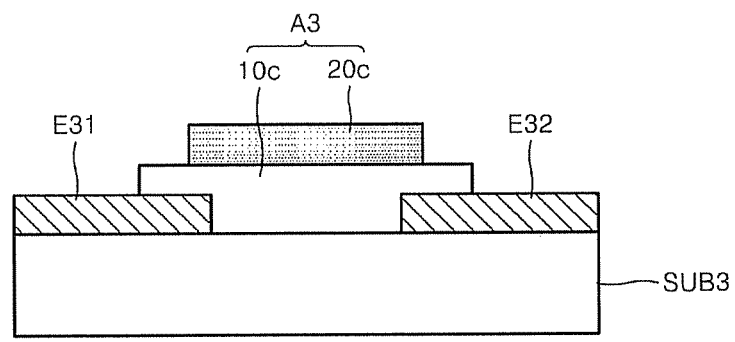

Referring to FIG. 10C, a second layer 20c may be formed on the first layer 10c. The second layer 20c may be separated from the first and second electrodes E31 and E32. The second layer 20c may be formed of material having higher electrical conductivity and/or charge mobility than the first layer 10c. In addition, the second layer 20c may be formed of a material that ohmic-contacts the first layer 10c. The second layer 20c may be a metallic layer or a semiconductor layer.

For example, the second layer 20c may include graphene. When the second layer 20c is formed of graphene, a method of forming the second layer 20c may be the same as or similar to the method of forming the second layer 20a as illustrated in FIG. 9B. In addition, the second layer 20c may include metal, such as Au, Cu, Ni, or Pt, or a semiconductor, such as $MoS_2$. However, the material for forming the second layer 20c is just an example and may vary in various ways. The first layer 10c and the second layer 20c may constitute an active layer A3.

Figure 10D:
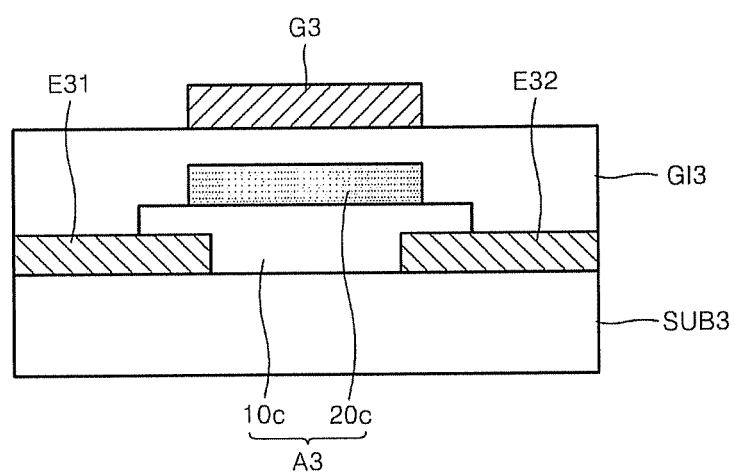

Referring to FIG. 10D, a gate insulating layer GI3 may be formed on the substrate SUB3 to cover the active layer A3 and the first and second electrodes E31 and E32. A gate G3 may be formed on the gate insulating layer GI3. The gate G3 may be formed above the active layer A3.

The method illustrated in FIGS. 10A through 10D may be modified in various ways. For example, after the first layer 10c is formed first and then, the first and second electrodes E31 and E32 may be formed to contact both ends of the first layer 10c. In this case, the semiconductor device of FIG. 4 may be manufactured. In addition, a predetermined (or, alternatively desired) insulating layer may be formed between the substrate SUB3 and the first layer 10c. In this regard, if necessary, the surface (top surface) of the insulating layer may be processed with a hydrophobic material. Otherwise, various modifications may be conducted.

Figure 12:
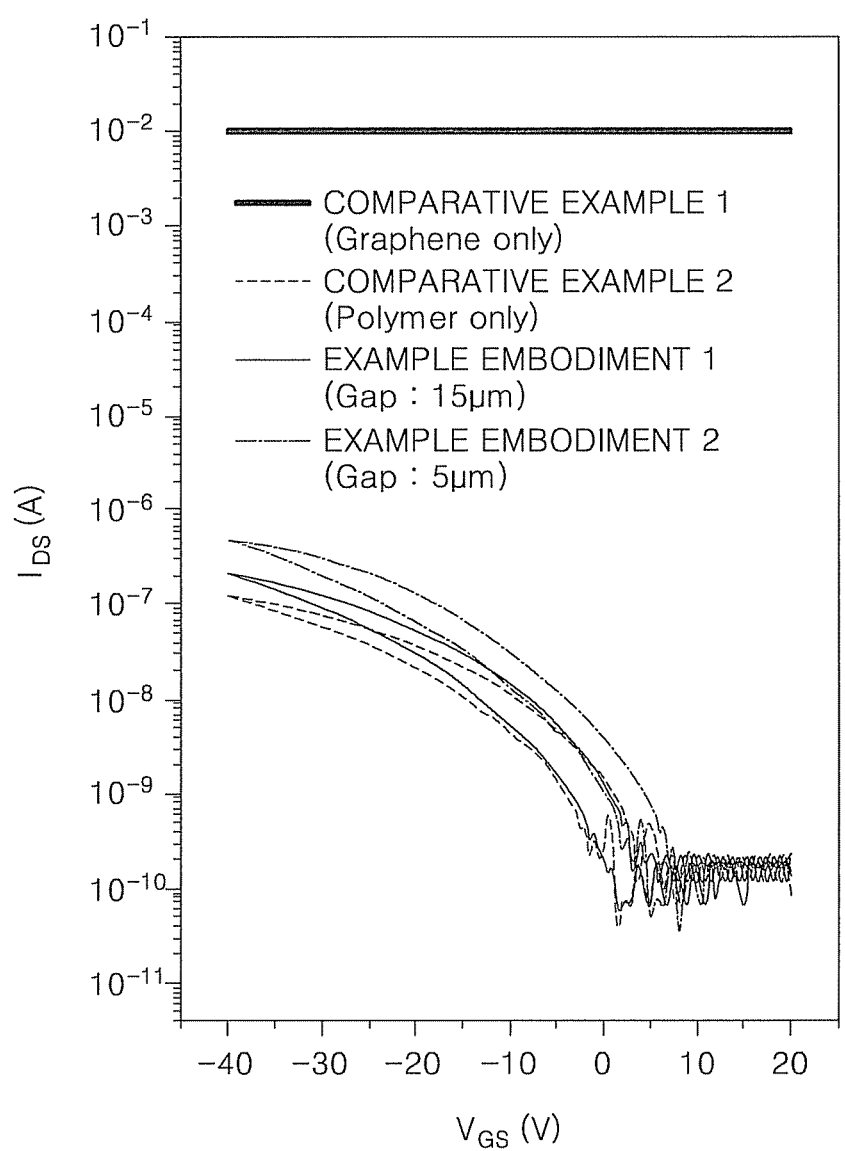

FIG. 12 is a graph showing variations in gate voltage $V_{GS}$-drain current $I_{DS}$ characteristics of semiconductor devices (transistors) according to example embodiments and comparative examples. The result of FIG. 12 is about semiconductor devices (transistors) of which surface of the gate insulating layer is not processed with a hydrophobic material. Example embodiment 1 is of a semiconductor device having the structure of FIG. 1 in which a gap between the second layer 20a and the first and second electrodes E11 and E12 is about 15 μm. Example embodiment 2 is of a semiconductor having the structure of FIG. 1 in which a gap between the second layer 20a and the first and second electrodes E11 and E12 is about 5 μm. In example embodiments 1 and 2, the material for the first layer 10a is thiophene-thiazole-based polymer (organic material), and the material for the second layer 20a is graphene. On the other hand, comparative example 1 is of a semiconductor device having a similar structure to FIG. 1 in which an active layer having a single layer structure and foamed of a graphene layer is used. Comparative example 2 is of a semiconductor device having a similar structure to FIG. 1 in which an active layer having a single layer structure and formed of a polymer layer is used. The polymer layer was a thiophene-thiazole-based polymer (organic material) layer.

Referring to FIG. 12, in comparative example 1 using an active layer having a single layer structure and formed of a graphene layer, an on/off current ratio is very low, and negligible switching characteristics are exhibited. Meanwhile, in comparative example 2 using an active layer formed of a polymer layer and having a single layer structure, switching characteristics are shown, but the level of a drain current $I_{DS}$ is relatively low. This means that, when the active layer formed of a polymer layer and having a single layer structure is used, the mobility of a semiconductor device (transistor) is relatively low. In semiconductor devices (transistors) according to embodiments 1 and 2, an on/off current ratio is significantly higher than in comparative example 1, and the level of the drain current $I_{DS}$ is higher than in comparative example 2. This means that, when an active layer A1 including the first layer 10a and the second layer 20a of FIG. 1 is used, a semiconductor device (transistor) having high mobility and superior on/off characteristics may be implemented. In particular, the mobility of the semiconductor device (transistor) according to embodiment 2 is higher than that of the semiconductor device (transistor) according to embodiment 1. This means that, as a gap between the second layer 20a and the first and second electrodes E11 and E12 decreases, the mobility of the semiconductor device (transistor) may increase.

The result of FIG. 12 may be summarized as the following Table 1.

TABLE 1

| | Comparative example 1 (graphene only) | Comparative example 2 (polymer only) | Example Embodiment 1 (FIG. 1, gap 15 μm) | Example Embodiment 2 (FIG. 1, gap 5 μm) |
|---|---|---|---|---|
| Mobility ($cm^2$/Vs) | — | 0.0075 ± 0.0006 | 0.0138 ± 0.0028 | 0.0243 ± 0.0011 |

As seen from Table 1, the mobility of the semiconductor devices (transistors) according to example embodiments 1 and 2 is about twice higher than that of the semiconductor device (transistor) according to comparative example 2.

Figure 13:
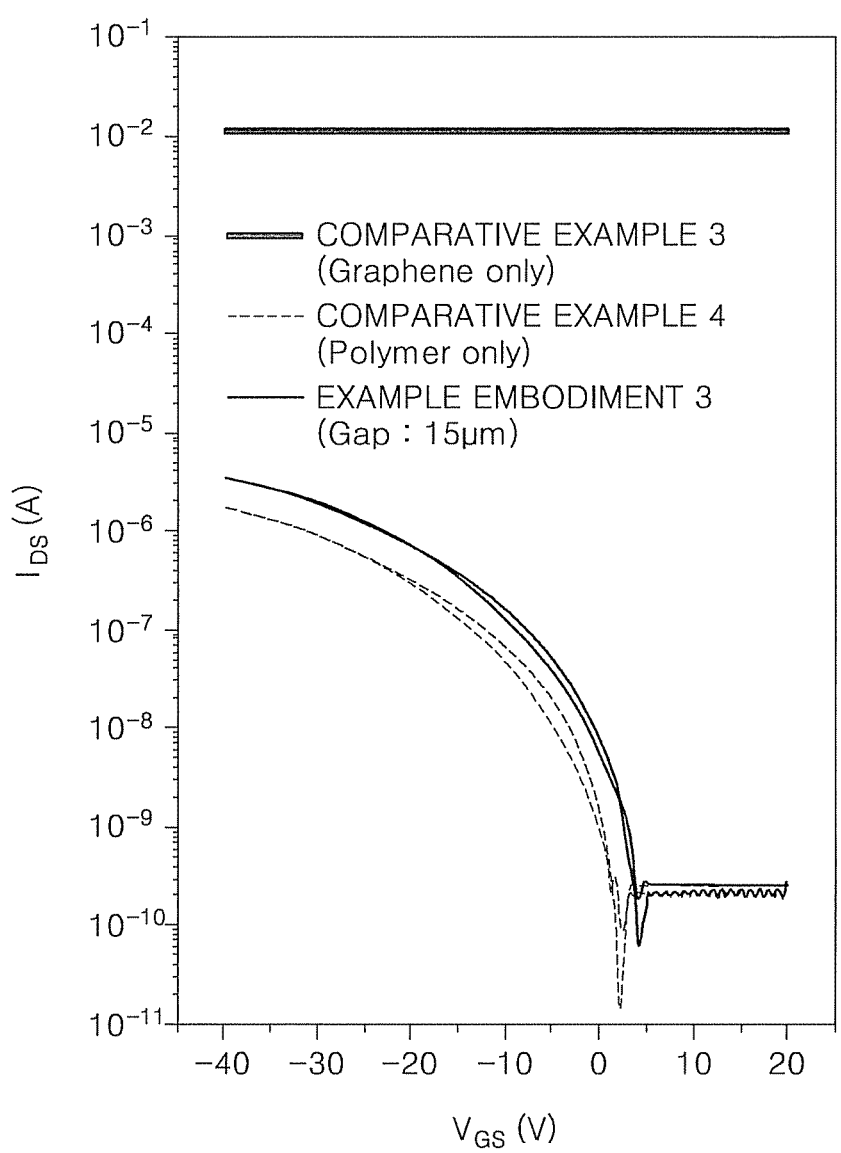

FIG. 13 is a graph showing variations in gate voltage $V_{GS}$-drain current $I_{DS}$ characteristics of semiconductor devices (transistors) according to example embodiments and comparative examples. The result of FIG. 13 is about semiconductor devices (transistors) of which surface of the gate insulating layer is processed with octadecyltrichlorosilane (ODTS) that is a hydrophobic material. Example embodiment 3 is a case where the semiconductor device (transistor) has the structure of FIG. 1 and a gap between the second layer 20a and the first and second electrodes E11 and E12 is about 15 μm. In example embodiment 3, a material for the first layer 10a is thiophene-thiazole-based polymer (organic material), and a material for the second layer 20a is graphene. Meanwhile, comparative example 3 is a case where the semiconductor device (transistor) has a similar structure to that of FIG. 1 and an active layer having a single layer structure and formed of a graphene layer is used.

Comparative example 4 is a case where an active layer having a single layer structure and formed of a polymer layer is used. The polymer layer is a layer formed of thiophene-thiazole-based polymer (organic material).

The result of FIG. 13 is similar to that of FIG. 12. In detail, an on/off current ratio of the semiconductor device (transistor) according to example embodiment 3 is significantly higher than in comparative example 3, and the level of the drain current IDS according to embodiment 3 is higher than in comparative example 4.

The result of FIG. 13 may be summarized as the following Equation 2.

TABLE 2

|  | Comparative example 3 (graphene only) | Comparative example 4 (polymer only) | Example Embodiment 3 (FIG. 1, gap 15 μm) |
|---|---|---|---|
| Mobility ($cm^2$/Vs) | — | 0.1380 ± 0.0028 | 0.2565 ± 0.0011 |

As seen from Table 2, the mobility of the semiconductor device (transistor) according to example embodiment 3 is about twice higher than that of the semiconductor device (transistor) according to comparative example 4. When, in the semiconductor device (transistor) according to example embodiment 3, a gap between the second layer 20a and the first and second electrodes E11 and E12 is smaller than 15 μm, the mobility of the semiconductor device (transistor) may further increase.

A semiconductor device according to example embodiments may be used in various types of electronic devices. For example, the semiconductor device according to example embodiment may be used in a display device, such as a liquid crystal display device, an organic light-emitting display device, and the like, as a switching device or a driving device. In addition, the semiconductor device may be used as a sensing device for a display device. Since the semiconductor device according to example embodiment may be flexible, a flexible display device may be implemented by using the semiconductor device. The structure of the liquid crystal display device and the organic light-emitting display device is well-known to one of ordinary skill in the art, and thus a detailed description thereof will be omitted. In addition, the semiconductor device according to example embodiment may be used in various types of sensors. For example, the semiconductor device may be used as a chemical sensor or an optical sensor and may be used in various types of electronic devices using the chemical sensor or the optical sensor. Besides, the semiconductor device according to example embodiments may be used in other electronic devices, such as memory devices, logic devices, and the like, for various purposes.

From the above description, it will be understood by one of ordinary skill in the art that the structures of the semiconductor devices illustrated in FIGS. 1 through 8 may modified in various desired ways. In detail, the first layers 10a through 10d may include an inorganic semiconductor, and the second layers 20a through 20d may contact one of the first and second electrodes E11 through E41 and E12 through E42, and the first layers 10a through 10d and/or the second layers 20a through 20d may have multi-layer structures. In addition, a semiconductor device according to example embodiments may have a double gate structure. The methods illustrated in FIGS. 9A through 9D and the methods illustrated in FIGS. 10A through 10D may be changed in various ways. Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A semiconductor device comprising:
a first electrode on a supporting layer;
a second electrode apart from the first electrode on the supporting layer; and
an active layer between the first and second electrodes,
wherein the active layer includes first and second layers, a portion of the first layer overlapping at least a portion of a sidewall of the first and second electrodes, the entire second layer being separated from at least one of the first and second electrodes by a gap, and the first layer covering an upper surface and side surfaces of the second layer in contact with the supporting layer.

2. The semiconductor device of claim 1, wherein the first layer comprises an organic semiconductor.

3. The semiconductor device of claim 1, wherein the second layer comprises a material having higher electrical conductivity than the first layer.

4. The semiconductor device of claim 1, wherein the second layer comprises a material having higher charge mobility than the first layer.

5. The semiconductor device of claim 1, wherein the second layer comprises a metallic layer or a semiconductor layer.

6. The semiconductor device of claim 5, wherein the second layer comprises at least one selected from the group consisting of graphene, silver (Au), copper (Cu), nickel (Ni), platinum (Pt), and molybdenum disulphide ($MoS_2$).

7. The semiconductor device of claim 1, wherein the first layer and the second layer are in ohmic contact with each other.

8. The semiconductor device of claim 1, wherein a portion of the first layer is between the second layer and at least one of the first and second electrodes.

9. The semiconductor device of claim 1, further comprising:
a gate configured to apply an electric field to the active layer.

10. The semiconductor device of claim 9, wherein the second layer is closer to the gate compared to the first layer.

11. The semiconductor device of claim 9, wherein the gate is below the active layer.

12. The semiconductor device of claim 9, wherein the gate is above the active layer.

13. The semiconductor device of claim 1, wherein the first and second electrodes contact a lower surface portion of the first layer.

14. The semiconductor device of claim 1, wherein the first and second electrodes contact an upper surface portion of the first layer.

15. The semiconductor device of claim 1, wherein the gap between the second layer and at least one of the first and second electrodes is less than several tens of micrometers (μm).

16. The semiconductor device of claim 15, wherein, when the second layer is at a same level as the first and second electrodes, the gap between the second layer and at least one of the first and second electrodes is in a range of several hundreds of nanometers (nm) to several tens of micrometers (μm).

17. The semiconductor device of claim 15, wherein, when the second layer is at a different level than the first and second electrodes, the gap between the second layer and at least of the first and second electrodes is in a range of several tens of nanometers (nm) to several micrometers (μm).

18. The semiconductor device of claim 1, wherein the semiconductor device is flexible.

19. The semiconductor device of claim 1, wherein the semiconductor device is a sensor.

20. The semiconductor device of claim 19, wherein the sensor is a chemical sensor or an optical sensor.

21. The semiconductor device of claim 9, wherein the semiconductor device is a switching device or a sensor.

22. The semiconductor device of claim 9, wherein the semiconductor device is a thin film transistor.

23. A transistor comprising:
a source and a drain separated from each other;
a channel layer between the source and the drain; and
a gate configured to apply an electric field to the channel layer,
wherein the channel layer is a multi-layer structure including a first layer and a second layer on a supporting layer, a portion of the first layer overlapping at least a portion of a sidewall of the source and the drain, the first layer including an organic semiconductor, the second layer including a material having higher electrical conductivity than the organic semiconductor, the entire second layer being separated from at least one of the source and the drain by a gap, and the first layer covering an upper surface and side surfaces of the second layer in contact with the supporting layer.

24. The transistor of claim 23, wherein the second layer is closer to the gate compared to the first layer.

25. The transistor of claim 23, wherein the second layer is a metallic layer or a semiconductor layer.

26. The semiconductor device of claim 1, wherein the first layer has a width greater than a gap between the first electrode and the second electrode.

27. The semiconductor device of claim 1, wherein the portion of the first layer overlaps at least a portion of an upper surface and sidewall of the first and second electrodes.

* * * * *